US 6,717,685 B1

(12) United States Patent
Chen

(10) Patent No.: US 6,717,685 B1
(45) Date of Patent: Apr. 6, 2004

(54) IN SITU PROXIMITY GAP MONITOR FOR LITHOGRAPHY

(75) Inventor: Alek C. Chen, Mount Kisco, NY (US)

(73) Assignees: BAE Systems Information, Nashua, NH (US); Electronic Systems Integration, Inc., Nashua, NH (US)

( * ) Notice: Subject to any disclaimer, the term of this patent is extended or adjusted under 35 U.S.C. 154(b) by 0 days.

(21) Appl. No.: 09/502,062

(22) Filed: Feb. 10, 2000

Related U.S. Application Data
(60) Provisional application No. 60/155,571, filed on Sep. 24, 1999.

(51) Int. Cl.[7] .......................... G01B 11/14; G01B 11/28
(52) U.S. Cl. ....................................... 356/625; 356/630
(58) Field of Search ................. 356/625–630, 356/631, 632, 635, 636, 614–624, 399–401

(56) References Cited

U.S. PATENT DOCUMENTS

| | | | |
|---|---|---|---|
| 5,285,259 A | * | 2/1994 | Saitoh .................. 356/401 |
| 5,327,221 A | | 7/1994 | Saitoh et al. |
| 5,373,232 A | | 12/1994 | Cresswell et al. |
| 5,585,211 A | | 12/1996 | Firstein et al. |
| 5,656,403 A | | 8/1997 | Shieh |

OTHER PUBLICATIONS

Scott Hector et al. "X–Ray Lithograpy for ≦100 nm Ground Rules In Complex Patterns," J. Vac. Society Technol. B, Vol 15, No 6, Nov./Dec. 1997, pp. 2517–2521.

* cited by examiner

*Primary Examiner*—Frank G. Font
*Assistant Examiner*—Amanda Merlino
(74) *Attorney, Agent, or Firm*—Swidler Berlin Shereff Friedman, LLP

(57) ABSTRACT

A method and a system for implementing the method for determining an exposure gap between a mask and a resist material are provided. A first gratings is provided on one or more sides of a first structure defined by one or more first regions of the mask. A second gratings is provided on one or more sides of a second structure defined be one or more second regions of the mask. The first and the second structures are exposed to incident energy and the difference between a location in the first structure and a location in the second structure is measured. The exposure zap is extrapolated from the difference. The first and second structures are provided on the mask. The first gratings and the second gratings is provided by a mask writing tool.

20 Claims, 7 Drawing Sheets

IN SITU PROXIMITY GAP MONITOR FOR LITHOGRAPHY

The following document claims priority from U.S. Provisional Patent Application No. 60/155,571, filed Sep. 24, 1999.

The United State Government has certain rights in this invention under the terms of Contract No. N00019-91-C-0207, awarded by the Department of the Navy.

BACKGROUND OF THE INVENTION

1. Field of the Invention

The following invention relates generally to micro electronics manufacturing, and specifically to proximity X-ray lithography.

2. Related Art

Large scale integrated circuits (LSIs) are continuing to push the envelope of increasing a complexity on sermiconductor chips, with the advent of very large scale integrated circuits (VLSIs) and ultra large scale integrated circuits (ULSIs). An increasing number of circuit elements, like transistors, resistors, and capacitors are added with metal interconnections, to increase the size and complexity of chips.

Semiconductor chips are manufactured using a series of masks in the lithographic process. During lithography, successive patterns of materials on and regions in a semiconductor wafer are chemically or photochemically induced onto the surface of the wafer using the mask as a template. The patterns, including lines and holes, define the circuit elements, such as transistors.

Initially, the semiconductor wafer is covered with resist material, such as photoresist. The resist material is responsive to incident energy, such as an electromagnetic radiation. Examples of electromagnetic waves used are visible light, ultraviolet light, electron beams, and x-rays. Where the resist material is exposed to the radiation, it chemically activates the resist, by for example etching a hole in the substrate.

In lithography, the mask is used to determine where the electromagnetic radiation is permitted to contact the resist material. The mask functions to mask certain regions of the resist material from the incident energy but not other regions, by permitting the radiation to pass through some regions (called transmissive regions), and preventing the radiation from passing through other regions (called non-transmissive regions).

There are different types of lithography. One type of lithography uses projection optics. In this type of lithography, the pattern on the mask is reduced in size using special optical lenses before being transmitted to the resist material using the incident energy.

Another type of lithography is proximate lithography. In this type of lithography, there is a one-to-one correspondence in size between the pattern and the mask, meaning the pattern is not reduced or enlarged in size before being transmitted onto the mask using the incident energy. In proximate lithography, the size of the printing gap (also called an exposure gap or space) between the resist on the wafer and the mask is quite significant. For modem chips, gaps on the order of 10–40 microns are required for the patterns.

Proximate lithography exposure and aligner tools are machines used to align the mask on the wafer. There are numerous aligners used by persons skilled in the art. One manufacturer of an aligner is Silicon Valley Group Lithography (SVGL). Another manufacturer is Suss Advanced Lithography (SAL).

For modern chips, pattern lines having dimensions on the order of less than 200 nanometers must be drawn. The smaller the width of the pattern line, the narrower the exposure gap that is required. For a 200 nm dimension, gap sizes on the order of 20 micrometers are required.

The gap can vary because of such factors as: illumination non-uniformities, which are non-uniformities based on varying illuminations by the incident energy source (i.e., different exposures in different areas on the wafer); the wafer being originally placed such that the gap is non-uniform; and non-uniformities caused by the movement of the wafer, either when it is brought in the proximity to the mask during exposure or moved along the plane of the wafer during the exposure (known as stepping).

Typically, the gap is not measured directly when incident energy exposures are performed. The gap is measured between exposure steps of the aligner and exposure tool, when the tool exposes the mask to incident energy. It is hoped that the gap does not change during the exposure step. The average gap between the mask and the wafer, as well as the tilt (or the variation in the gap between different regions of the wafer) is not known during actual exposure.

This exposure gap verification is difficult to perform directly, because time consuming scanning electron microscopy measurements are needed to infer the exposure gap. Therefore, independent verification of the gap settings of the, exposure and aligner tool cannot be performed frequently, because of the time consuming, difficult procedures involved. What is required is a simpler, less time-consuming, more cost-effective way of determining the exposure gap between the exposure steps of the exposure tool.

SUMMARY OF THE INVENTION

The present invention is directed to a method, and a system for implementing the method, for determining an exposure gap between a mask and a resist material, where the resist material is exposed to an incident energy transmitted through exposure regions of the mask. The method includes the steps of: providing first gratings on one or more sides of a first structure defined by one or more first regions of the mask; providing second gratings on one or more sides of a second structure defined by one or more second regions of the mask; exposing the first and the second structures to the incident energy; measuring a difference between a location in the first structure and a location in the second structure; and extrapolating the exposure gap from the difference.

In one embodiment, a mask writing tool is used to provide the first gratings and the second gratings.

The step of providing the first gratings can include the step of: providing gratings on a pair of adjacent edges of an internal box structure defined by the one or more first regions. The step of providing the second gratings includes the step of: providing gratings on a pair of adjacent edges of an external box structure defined by the one or more second regions located opposite from the pair of adjacent edges of the internal box structure.

In one embodiment, the step of providing the first gratings includes the step of: providing gratings on a pair of opposite edges of an internal box structure defined by the one or more first regions. In this embodiment, the step of providing the second gratings includes the step of: providing gratings on a first edge of the internal box structure and on a second edge of an external box structure defined by one of the second regions, the first and the second edge being located opposite from one another.

In another embodiment, the step of providing the first gratings includes the step of: drawing a plurality of pattern lines having relatively thin width portions and relatively thicker finger projectile portions on a semiconductor resist material, the thin width portions and the finger projectile portions placed in an adjacent manner to form a comb-like pattern. The step of providing the second gratings can also include the step of: drawing a plurality of pattern lines having relatively thin width portions and relatively thicker finger projectile portions on a semiconductor resist material, the thin width portions and the finger projectile portions placed in an adjacent manner to form a comb-like pattern.

In one embodiment, the method further includes providing the first gratings and the second gratings to have the same pattern line widths. In another embodiment, the method further includes providing the first gratings and the second gratings to have different pattern line widths from one another.

The above measuring step can include the step of: measuring a difference between a center in the first box structure and a center in the second box structure. The above extrapolating step can include the step of: applying an empirical relationship between a given pattern line width, a given exposure gap, and a given line shortening effect to determine the exposure gap. A proximate lithography metrology tool can be used to implement the applying step.

BRIEF DESCRIPTION OF THE DRAWINGS

The present invention will be described with reference to the accompanying drawings, wherein.

In the figures, like reference numbers generally indicate identical, functionally similar, and/or structurally similar elements. The figure in which an element first appears is indicated by the leftmost digit(s) in the reference number.

DETAILED DESCRIPTION OF THE PREFERRED EMBODIMENTS

In the following description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

The present invention uses test structures to simply and cost-effectively solicit exposure gap information between the exposure steps of proximity lithography. The test structures take advantage of the relationship between the width of a pattern line, the exposure gap, and the tendency of the pattern line to shorten following an exposure step. By measuring the test structure post an exposure, the exposure gap is easily determined for each exposure step, and for each variation in an exposure step.

Figure 1:
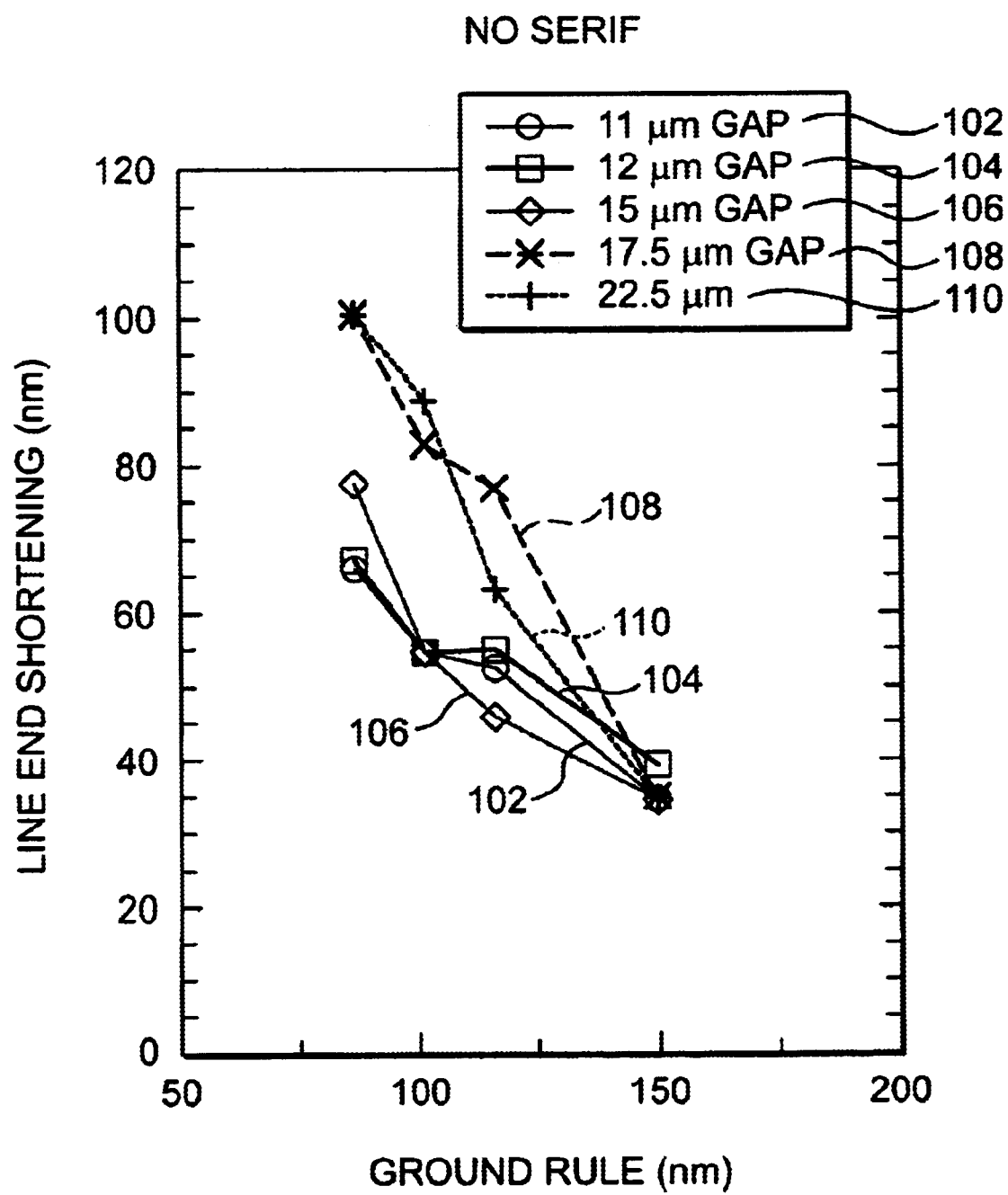
FIG. 1 is a graphical representation of the pattern line shortening effect based on exposure, derived from empirical data.

FIG. 1 is a graphical representation of the pattern line shortening effect based on exposure, derived from empirical data FIG. 1 is based on the work of Scott Hector et al. (Scott Hector et aL, "Electron Ion Photon Beam Nanotechnology Conference", 1997), incorporated herein by reference in its entirety.

The abscissa expresses the ground rule (or width of the pattern line) in nanometers. The ordinate expresses how much each pattern line shortens in nanometers.

There are a variety of lines presented, each having a different exposure gap, which as noted, is the gap between the mask and the resist material. Line 102 is an 11 micrometer exposure gap, meaning it provides the relationship between the line width and the line shortening effect for an 11 micrometer exposure gap. Line 104 is a 12 micrometer exposure gap. Line 106 is a 15 micrometer exposure gap. Line 108 is a 17.5 micrometer exposure gap. Line 110 is a 22.5 micrometer exposure gap.

As illustrated, each of lines 102–110 shorten post exposure. Exposure refers to the exposure of the mask and resist material to an incident energy source, such as x-rays, used in proximity lithography.

However, the line shortening effect is even more pronounced with larger gaps. For example, At lines 108 and 110, which represent the 17.5 and 22.5 micrometer gaps, respectively, have the steepest declining slopes. Here, the line shortening varies dramatically for given changes in the pattern line widths. For lines 102, 104, 106, which represent the 11, 12 and 15 micrometer gaps, respectively, the line shortening varies less drastically for given changes in the line widths.

The line shortening effect differences, for different gaps, can also be viewed by fixing the line width. For a ground rule of 100 nanometers, the line shortening for gaps 102–106 are fixed at approximately 58 nanometers, but is much larger for wider gaps of above 15 micrometers (lines 108, 110).

Figure 2:
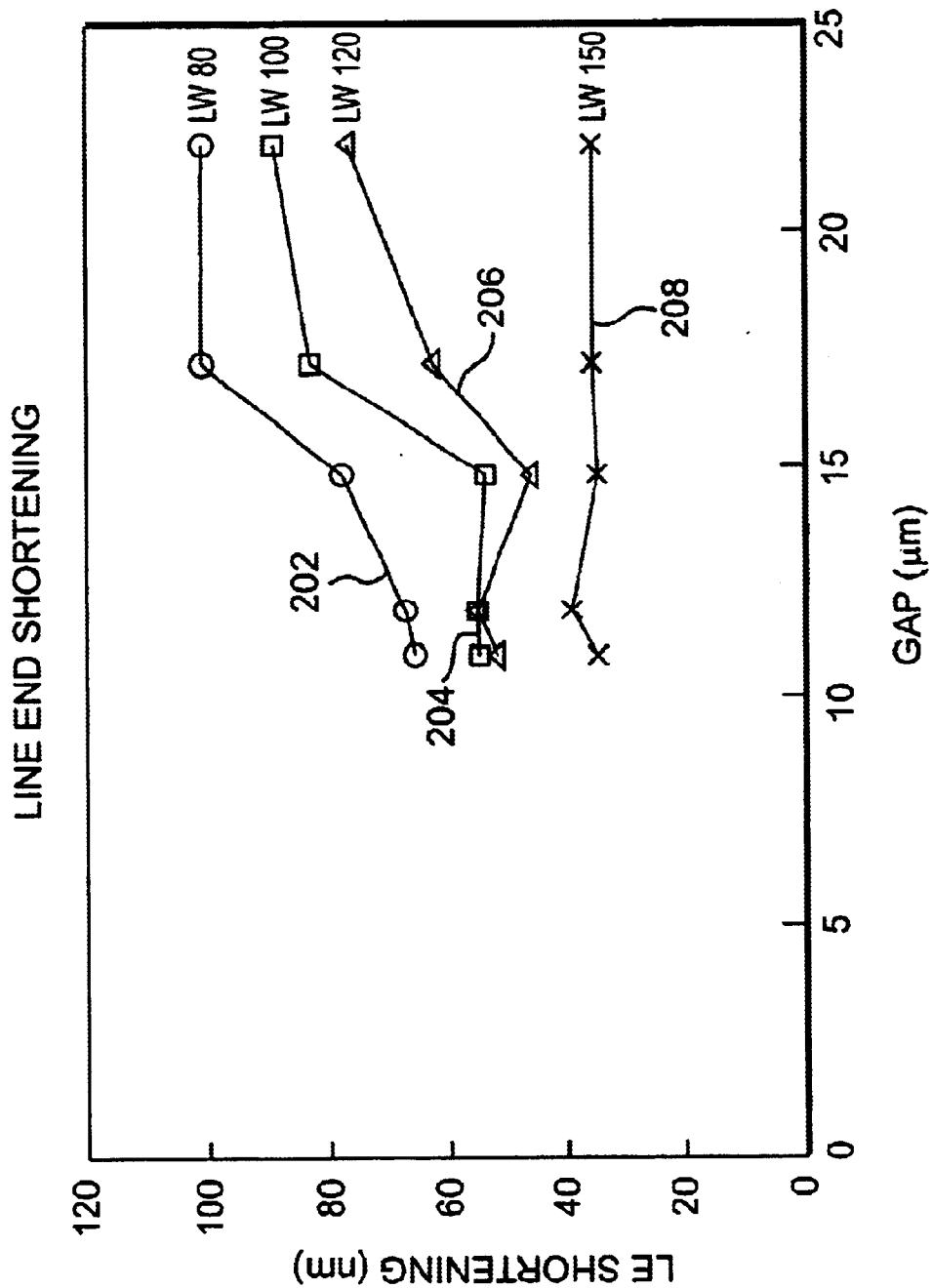
FIG. 2 is a second graphical representation of the pattern line shortening effect based on the empirical data.

FIG. 2 is a second graphical representation of the pattern line shortening effect based on the empirical data presented in FIG. 1. Here, the exposure gap is the abscissa, in micrometers, and the line shortening is provided as ordinate in nanometers, as a function of the gap.

Lines 202, 204, 206 and 208 express the relationship between the gap and the line shortening for different values of line widths, Line 202 is the relationship for a line width of 80 nanometers. Line 204 is the relationship for a line width of 100 nanometers. Line 206 is the relationship for a line width of 120 nanometers. Line 208 is the relationship for a line width of 150 nanometers.

FIG. 2 illustrates that for a fixed gap, the line shortening effect is more pronounced for narrower lines. For example, at a gap of 12 micrometers, the line shortening effect for line 202 (line width 80) is almost 70 nanometers, whereas for the same gap, the line shortening effect for line 208 (line width 150) is approximately 40 nanometers.

It should also be noted that lines 202–208 generally increase in line shortening effect as the gap increases. For example, for a gap of approximately 12 nanometers to a gap of approximately 17 nanometers, the line shortening effect of line 202 increases, because the slope of line 202 is positive.

However, these increases of line shortening with increases in gap are not necessarily monotonic. From FIG. 2, line 202 levels off from a gap of approximately 17 nanometers to a gap of approximately 22 nanometers. However, the overall change in line shortening between the endpoints of line 202 (approximately 11 nanometers to approximately 22 nanometers) is an increase.

Similarly, there are portions of the lines where a greater gap actually causes a decrease in line shortening. This is true, for example, for line 206 (line width 120 nanometers) between a gap of approximately 12 micrometers to a gap of approximately 15 micrometers.

Figure 3:
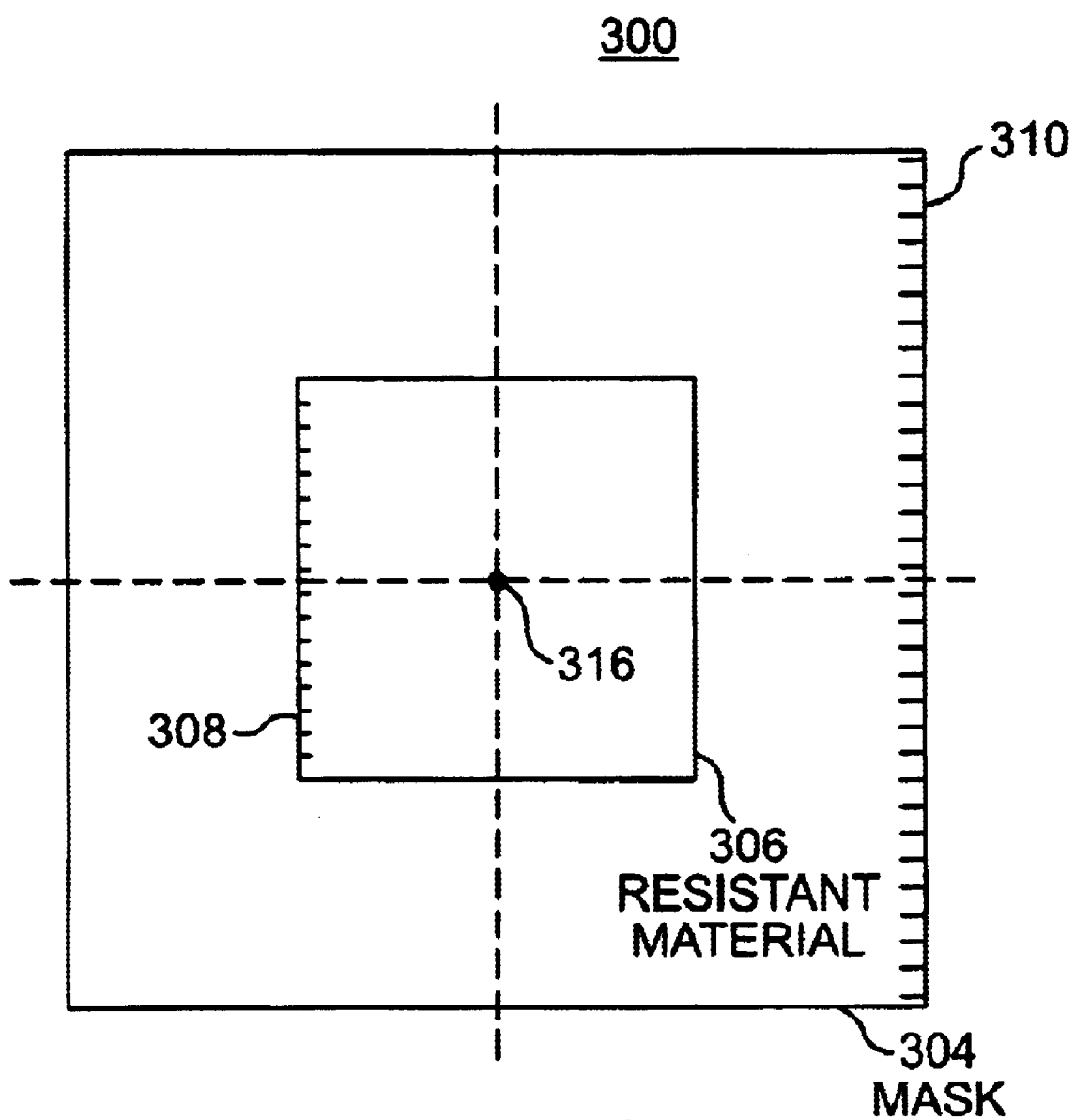
FIG. 3 is a top view, illustrating a modified box-in-box overlay metrology target.

The following figures are used to describe the present invention. FIG. 3 is a top view, illustrating a modified box-in-box overlay metrology target 300. Target 300 includes a photolithography mask. The mask has a covered area 306. In other words, the mask is actually a membrane (comprising metal materials or the like, as recognized by those skilled in the art) covering this region. The incident energy, such as an x-ray beam, is not permitted to penetrate this covered area. However, the incident energy is permitted to penetrate the region between box 306 and box 304. In one embodiment, box 304 is on the order of approximately 20 microns by 20 microns.

Target 300 includes two gratings regions 308 and 310. Gratings are modified portions of line patterns, as described below with respect to FIG. 4. Gratings 310 cover the right vertical side of box 310. Gratings 308 cover the left vertical side of box 308. Gratings regions 308, 310 are also referred to as test structures. These test structures are used to determine the gap between the mask and resist material below the mask, using the relationships expressed in FIGS. 1 and 2.

Also illustrated are center lines 312 and 314. Center lines 312, 314 are the center lines of both boxes 304 and 306. Center lines 312, 314 cross at 316, which is the geometric center of both boxes 302 and 306.

Although in the present embodiment opposite gratings on single sides of the boxes are used (e.g., gratings 308 and gratings 310), those skilled in the art will recognize that other variations are also possible. For example, it is possible to place gratings on the bottom horizontal and left vertical side of box 308, and the top horizontal and right vertical side of box 308. This will be made clear from the discussion below.

Figure 4:
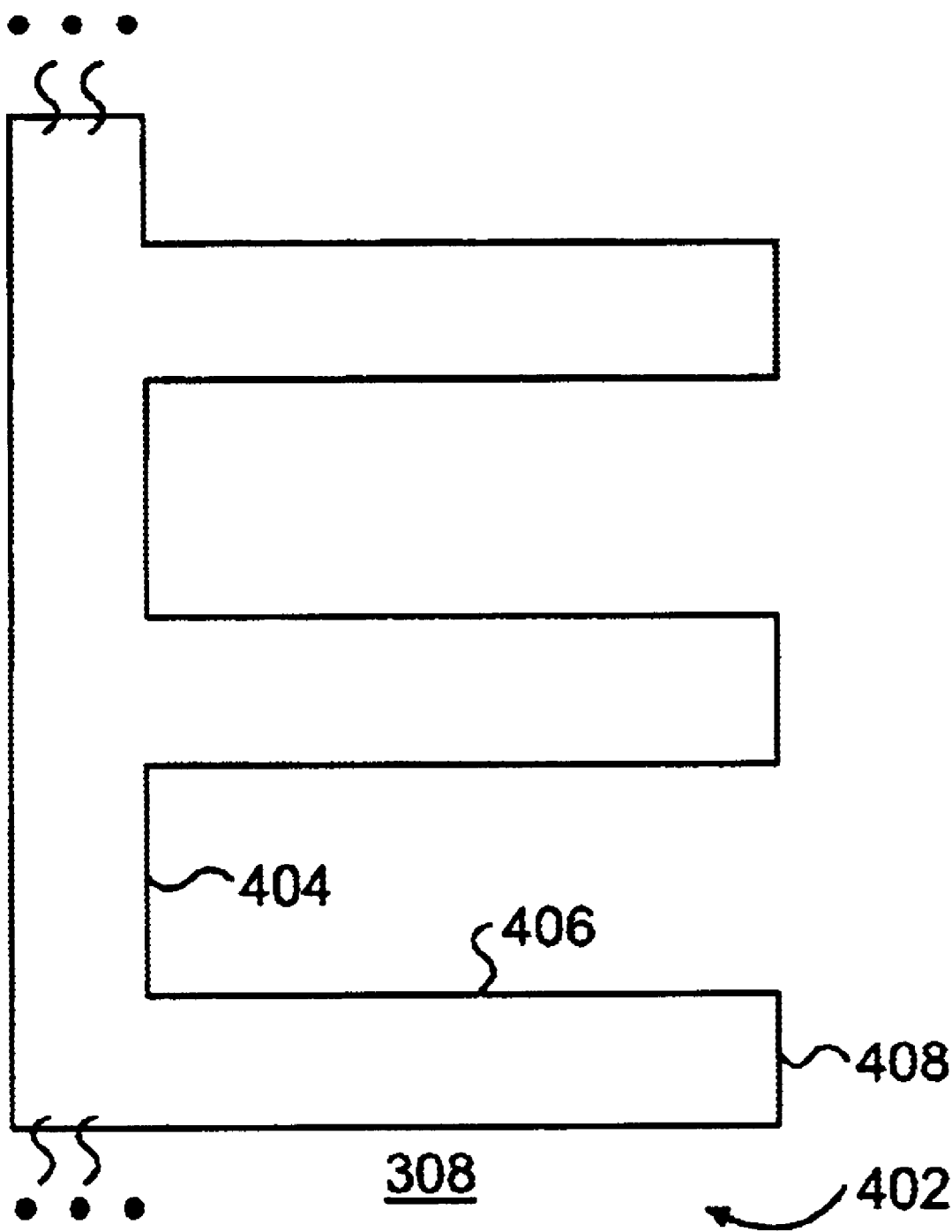
FIG. 4 is an exemplary portion of gratings as provided in the present invention.

FIG. 4 is an exemplary portion of gratings 308. The gratings are illustrated to comprise a narrow region 404 and a finger region 402. This pattern of narrow and finger regions are repeated to create the gratings 308. Therefore, gratings 308 has a comb structure.

Finger region 402 comprises a width portion 408 and a projectile portion 406. In one embodiment, the length of narrow region 404 is 200–400 nanometers. In the same embodiment, finger region 402 has a projectile portion 406 of 1000–2000 nanometers, and a width portion 408 of 80–100 nanometers. Any standard mask writing tool can create the gratings provided in this embodiment.

Figure 5:
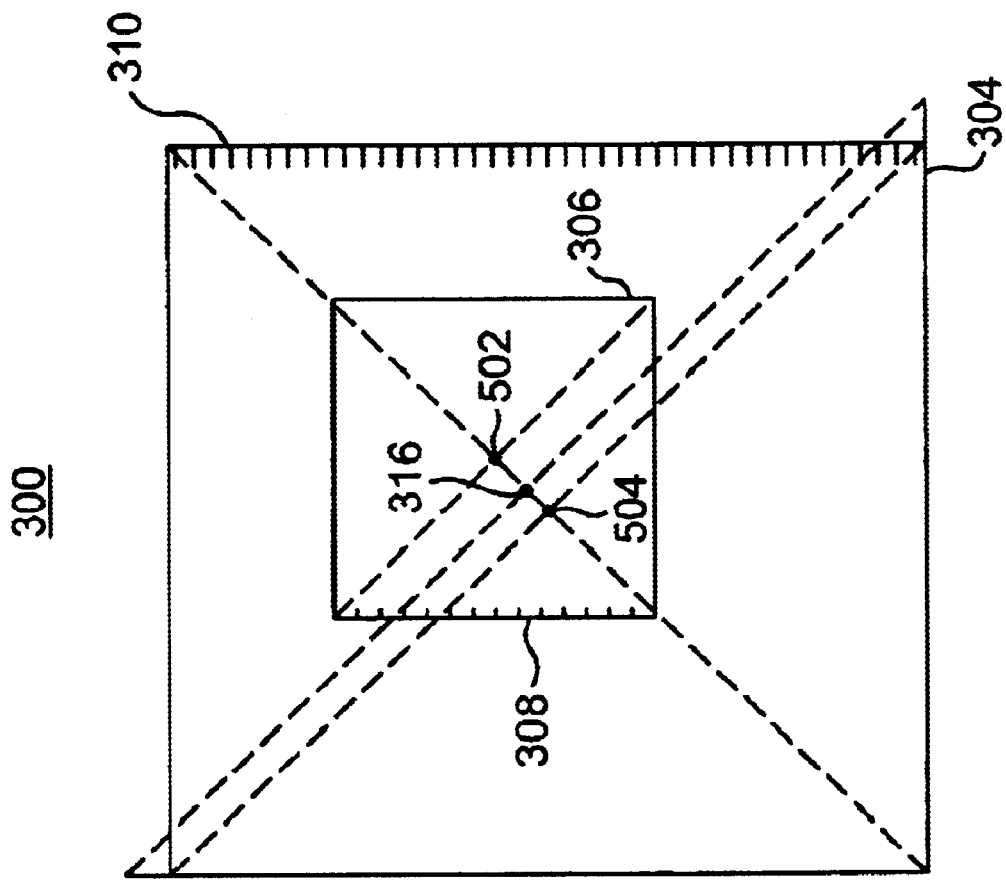
FIG. 5 illustrates a target post exposure from an incident energy source.

FIG. 5 illustrates target 300 post exposure from the incident energy. Because of the structure of the gratings (especially the thin width portions 408, the thin projectile portions 404, and the narrow regions 404) gratings 308 and 310 decrease substantially in comparison to the opposite sides of the boxes, which have no gratings. As illustrated in FIGS. 1 and 2, the width of the line is directly related to the line shortening effect. This distortion of gratings 308, 310 causes a shift of the respective centers of the boxes in a direction opposite to the gratings portions. As illustrated, the center of first covered area 306, now labeled 502, is distorted upward and to the right of the original center 316 (illustrated in FIG. 3). Similarly, the center of box 304, now labeled 504, is distorted downward and to the left of the original center 316 (illustrated in FIG. 3).

When viewed through an optical microscope, gratings 308, 310 appear gray, due to the finger regions 402. By comparing the distance between center 502 and center 504, the metrology tool can determine the exposure gap. The line shortening effect is determined by the distance between center 502 and center 504. If the width is the same for gratings 308, 310, there is a combined effect between the line contraction causing center 502 and the line contraction causing, center 504. For example, if the width of the pattern line of gratings 308 and 310 is 80 nanometers, the distance between 502 and 504 corresponds to a line shortening effect for a 160 nanometer line. The test structures can also be placed on production wafers to measure the variation of the gap across the wafer, including the tilt of the wafer.

In one embodiment, the line width, i.e., the width of the gratings 308, 310 is preassigned. From the line width and the line shortening effect, it is possible to use the empirical data from FIG. 2 (or FIG. 1) to determine the exposure gap of the target. The actual value of the exposure gap may not be important. For example, in one embodiment, test wafers with different tool settings (corresponding to gaps) are exposed to a dose of incident energy. Subsequently the resulting critical dimensions on the wafers are measured. From this data, a tool calibration chart is created, which compares the tool settings with the critical dimensions on the wafer. The chart can also be expanded by varying the tool settings for the dose with a fixed gap. For a fixed gap, the dose can also be varied to obtain a desired wafer critical dimension. Therefore, the exposure gap is determined by correlation of data.

The exposure tool provides exposures of entire areas, which in one embodiment are approximately 30 millimeters by 30 millimeters. As noted, in one embodiment, the total structure of region 302 is 20 microns by 20 microns. From the correlation process, the exposure gaps for the regions within areas are determined.

Figure 6:
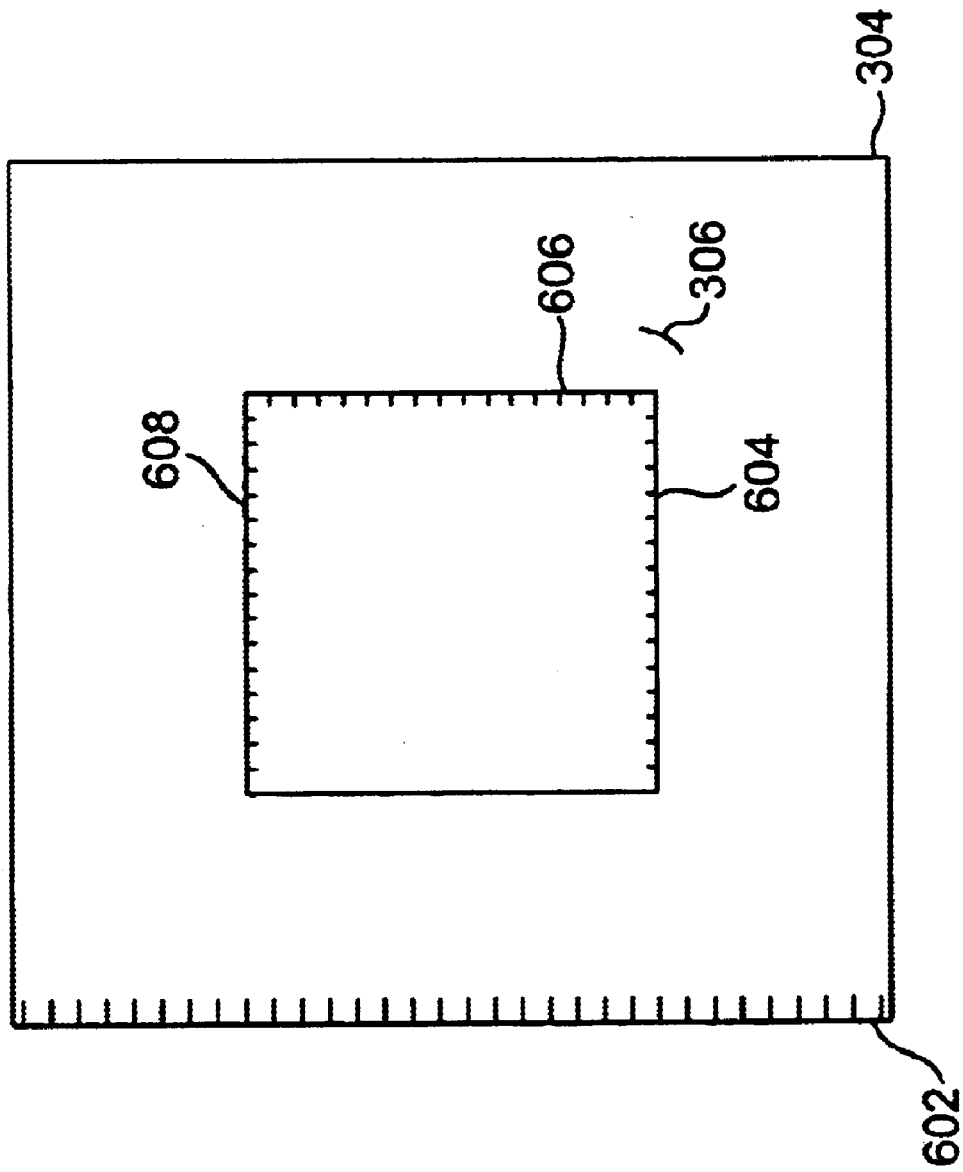
FIG. 6 illustrates the same target structure as in FIG. 3, to provide a different embodiment of the same essential concept.

FIG. 6 illustrates the same target structure as in FIG. 3, to provide a different embodiment of the same essential concept. To recapitulate, included are a photolithography mask, having a first covered area 306, and a second covered area comprising the region between box 302 and box 304. Here, however, the gratings regions are different. Region 306 has gratings 608 on the top, gratings 606 on the right side, and gratings 604 on the bottom thereof. Box 304, on the other hand, has gratings 602 on the left side of the box. How these gratings are used is explained below with reference to FIG. 7.

Referring back to line 206 (line width of 120 nanometers) of FIG. 2, there is an anomaly in that between at an approximately 13 micrometer gap and an approximately 15 nanometer gap, the line shortening effect actually decreases, instead of the expected increase.

It is possible to combine different pattern line widths for oppositely placed gratings in order to change the cumulative effect between the line shortening of the oppositely placed gratings. This is better illustrated by reference to FIG. 7.

Figure 7:
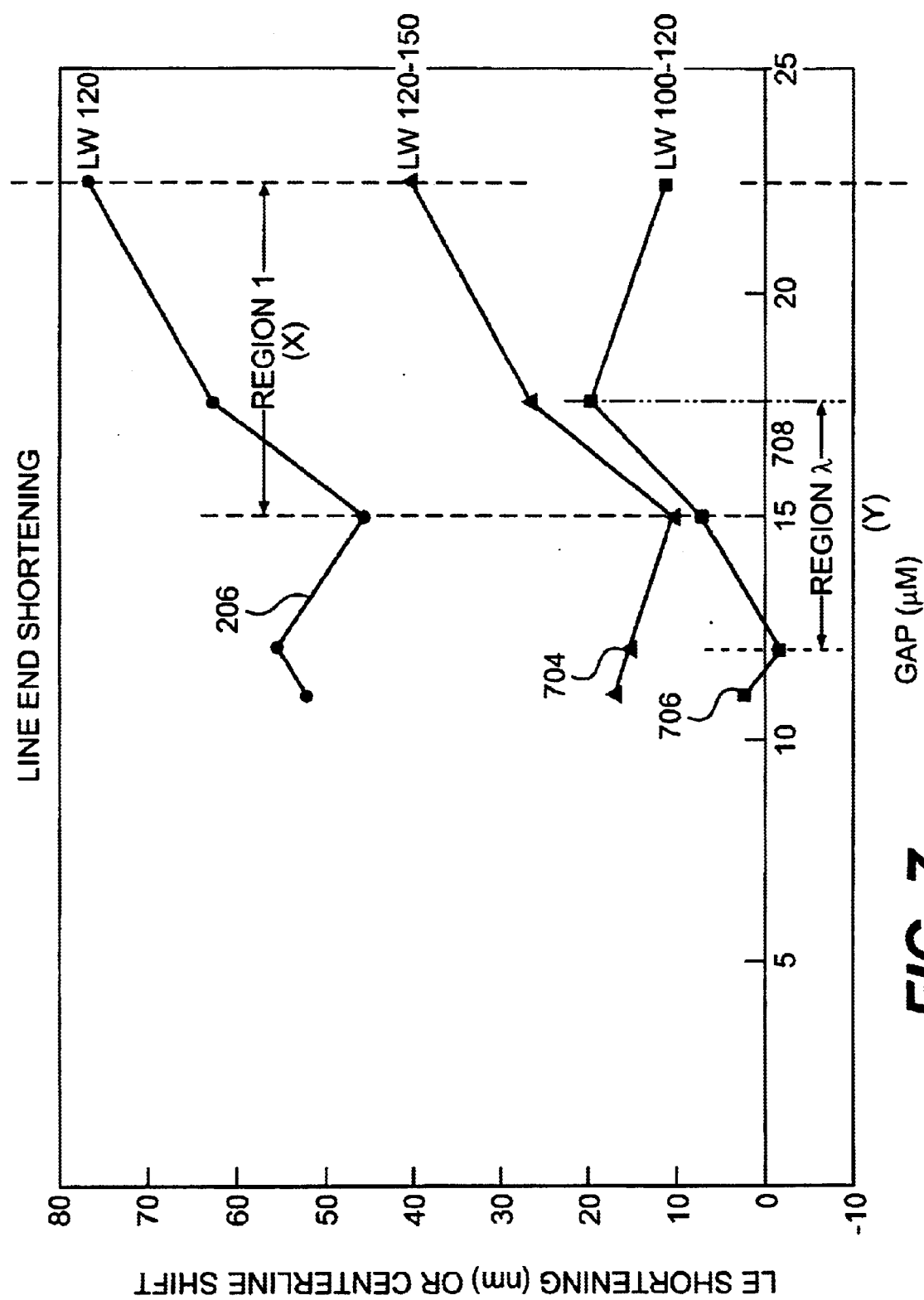
FIG. 7 is a third graphical representation of the pattern line shortening effect, illustrating respective line width differences.

FIG. 7 illustrates three lines 206, 704 and 706. Similarly to FIG. 2, the abscissa is the exposure gap in micrometers, and the ordinate is the line shortening in nanometers as a function of the exposure gap. As in FIG. 2, line 206 graphs the characteristics of a 120 nanometer line width. Instead of graphing single line widths, however, lines 704 and 706 graph the respective line width differences 120–150 nanometers and 100–120 nanometers.

As illustrated therein, line 206 (line width 120 nanometers) has an anomaly in region 708 (between approximately 13 nanometers and 17 nanometers), because the line shortening effect first decreases, then increases. By combining the effects of two line widths, however, it is possible to change the line shortening characteristic through cumulative effect. For example, referring to line 706, the resultant of the difference between a line width of 100 nanometers and a line width of 120 nanometers is shown to have a desired monotonically increasing shortening line effect in region 708.

Referring back to FIG. 6, gratings 608 and 604 are opposite from one another. By creating gratings 608 to have a line width of 100 nanometers and gratings 604 to have a line width of 120 nanometers, the characteristics of line 706 are produced for a center line shift between these lines. In other words, the amount of dislocation of a center point in box 306, between gratings 608 and gratings 604, can be used to determine the exposure gap in region 708.

While the invention has been particularly shown and described with reference to preferred embodiments thereof, it will be understood by those skilled in the relevant art that various changes in form and details maybe made therein without departing from the spirit and scope of the invention.

What is claimed is:

1. A method for determining an exposure gap between a mask and a resist material wherein the resist material is exposed to an incident energy transmitted through exposure regions of the mask, comprising:

providing first gratings on one or more sides of a first structure defined by one or more first regions of the mask;

providing second gratings on one or more sides of a second structure defined by one or more second regions of the mask;

exposing said first and said second structures to the incident energy;

measuring a difference between a location in said first structure and a location in said second structure; and determining the exposure gap from said difference;

wherein the first structure and the second structure is provided on the mask.

2. A method according to claim 1, further comprising;

using a mask writing tool to provide said first gratings and said second gratings.

3. A method according to claim 1, wherein providing said first gratings comprises:

providing gratings on an edge of an internal box structure defined by said one or more first regions, and wherein providing said second gratings comprises:

providing gratings on an edge of an external box structure defined by said one or more second regions located opposite from said adjacent edge of said internal box structure.

4. A method according to claim 1, wherein providing said first gratings comprises:

providing gratings on a pair of opposite edges of an internal box structure defined by said one or more first regions, and wherein providing said second gratings comprises:

providing gratings on a first edge of said internal box structure and on a second edge of an external box structure defined by one of said second regions, said first and said second edge being located opposite from one another.

5. A method according to claim 1, wherein providing said first gratings comprises:

drawing a plurality of pattern lines having relatively thin width portions and relatively thicker finger projectile portions on a semiconductor resist material, said thin width portions and said finger projectile portions placed in an adjacent manner to form a comb-like pattern.

6. A method according to claim 1, wherein providing said second gratings comprises:

drawing a plurality of pattern lines having relatively thin width portions and relatively thicker finger projectile portions on a semiconductor resist material, said thin width portions and said finger projectile portions placed in an adjacent manner to form a comb-like pattern.

7. A method according to claim 1, further comprising:

providing said first gratings and said second gratings to have the same pattern line widths.

8. A method according to claim 1, further comprising:

providing said first gratings and said second gratings to have different pattern line widths from one another.

9. A method according to claim 1, wherein measuring said first and said second structures comprises:

measuring a difference between a center in so a first box structure and a center in a second box structure.

10. A method according to claim 1, wherein determining the exposure gap from said difference comprises:

applying an empirical relationship between a given pattern line width, a given exposure gap, and a given line shortening effect to determine the exposure gap.

11. A method according to claim 10, comprising:

using an optical metrology tool to measure center line shifts of said first and said second structures.

12. A method according to claim 10, comprising:

using an alignment system of a proximity lithography exposure tool to measure center line shifts of said first and said second structures.

13. A method according to claim 1, wherein determining the exposure gap from said difference comprises:

exposing one or more test wafers to the incident energy, said one or more test wafers having different tool settings, said tool settings corresponding to one or more different exposure gaps;

measuring critical dimensions of said test wafers;

creating a calibration chart comparing said tool settings and said critical dimensions; and determining the exposure gap from said calibration chart.

14. A wafer, for determining an exposure gap between a mask and a resist material wherein the resist material is exposed to an incident energy transmitted through exposure regions of the mask, comprising:

first gratings provided on one or more sides of a first structure defined by one or more second gratings provided on one or more sides of a second structure defined by one or more second regions of the mask, wherein said first gratings and said second gratings are exposed to the incident energy, and wherein a difference between a location in said first structure and a location in said second structure is measured to determine the exposure gap therefrom; and wherein said first structure and said second structure is provided on the mask.

15. A wafer according to claim 14, wherein said first gratings are provided on an edge of an internal box structure defined by said one or more first regions, and wherein said gratings are provided on an edge of an external box structure defined by said one or more second regions located opposite from said edge of said internal box structure.

16. A wafer according to claim 14, wherein said first gratings are provided on a pair of opposite edges of an internal box structure defined by said one or more first regions, and wherein said second gratings are provided on a first edge of said internal box structure and on a second edge of an external box structure defined by one of said second regions, said first and said second edge being located opposite from one another.

17. A system for determining an exposure gap between a mask and a resist material wherein the resist material is exposed to an incident energy transmitted through exposure regions of the mask, comprising:

first device that provides first gratings on one or more sides of a first structure defined by one or more first regions of the mask and second gratings on one or more sides of a second structure defined by one or more second regions of the mask;

second device that measures a difference between a location in said first structure and a location in said second structure before and after said first and said second structures have been exposed to the incident energy, and determines the exposure gap based on said difference and, wherein said first structure and said second structure is provided on the mask.

18. A system according to claim 17, wherein said second device comprises:

device that exposes one or more test wafers to the incident energy, said one or more test wafers having different tool settings, said tool settings corresponding to one or more different exposure gaps;

device that measuring critical dimensions of said test wafers and creates a calibration chart comparing said tool settings and said critical dimensions; and device that determines the exposure gap from said calibration chart.

19. A system according to claim 17, wherein said second device comprises:

device that applies an empirical relationship between a given pattern line width, a given exposure gap, and a given line shortening effect to determine the exposure gap.

20. A system according to claim 17, comprises:

device that uses an optical metrology tool to measure center line shifts of said first and said second structures.

* * * * *

UNITED STATES PATENT AND TRADEMARK OFFICE
CERTIFICATE OF CORRECTION

| | | |
|---|---|---|
| PATENT NO. | : 6,717,685 B1 | Page 1 of 1 |
| APPLICATION NO. | : 09/502062 | |
| DATED | : April 6, 2004 | |
| INVENTOR(S) | : Alex C. Chen | |

It is certified that error appears in the above-identified patent and that said Letters Patent is hereby corrected as shown below:

On the title page, in section (73), please delete "BAE Systems Information, Nashua, NH (US); Electronic Systems Integration Inc." and insert therefor --BAE Systems Information and Electronic Systems Integration Inc.--

Signed and Sealed this

Fourth Day of January, 2011

David J. Kappos
*Director of the United States Patent and Trademark Office*